(12) United States Patent
Wrenner et al.

(10) Patent No.: US 11,789,477 B1
(45) Date of Patent: Oct. 17, 2023

(54) BIAS CURRENT WITH HYBRID TEMPERATURE PROFILE

(71) Applicant: Analog Devices, Inc., Norwood, MA (US)

(72) Inventors: Kevin R. Wrenner, Essex Junction, VT (US); Ruida Yun, Weston, MA (US); Kenneth G. Richardson, Longmont, CO (US)

(73) Assignee: ANALOG DEVICES, INC., Wilmington, MA (US)

( * ) Notice: Subject to any disclaimer, the term of this patent is extended or adjusted under 35 U.S.C. 154(b) by 0 days.

(21) Appl. No.: 17/901,244

(22) Filed: Sep. 1, 2022

Related U.S. Application Data (60) Provisional application No. 63/355,347, filed on Jun. 24, 2022.

(51) Int. Cl.
*G05F 3/16* (2006.01)
*G05F 1/567* (2006.01)
*G05F 3/26* (2006.01)

(52) U.S. Cl.
CPC ............ *G05F 1/567* (2013.01); *G05F 3/16* (2013.01); *G05F 3/262* (2013.01)

(58) Field of Classification Search
None
See application file for complete search history.

(56) References Cited

U.S. PATENT DOCUMENTS

| | | | | |
|---|---|---|---|---|
| 6,949,968 | B1* | 9/2005 | Mulligan | H03F 1/30 327/512 |
| 7,595,685 | B1* | 9/2009 | Sakurai | G05F 3/262 327/513 |
| 7,636,009 | B2* | 12/2009 | Jo | H03F 1/301 327/539 |
| 7,777,558 | B2* | 8/2010 | Chen | G05F 3/30 327/539 |
| 8,489,044 | B2* | 7/2013 | Oliaei | H04B 1/0475 455/114.3 |
| 9,081,555 | B2* | 7/2015 | Peng | G06F 1/206 |
| 9,401,680 | B2* | 7/2016 | Park | H03F 3/195 |
| 9,411,354 | B2* | 8/2016 | Hu | G05F 3/30 |
| 2016/0209861 | A1* | 7/2016 | Choi | G05F 3/242 |
| 2016/0307640 | A1* | 10/2016 | Candelier | G11C 7/04 |

* cited by examiner

*Primary Examiner* — Thomas J. Hiltunen
(74) *Attorney, Agent, or Firm* — ArentFox Schiff LLP (57) ABSTRACT

Aspects of the present disclosure include a hybrid circuit, including a first current sink configured to sink a zero temperature coefficient (ZTC) current, a second current sink configured to sink a positive temperature coefficient (PTC) current, a first transistor configured to provide a first current, a second transistor configured to provide a second current, a third transistor configured to provide a third current mirroring the ZTC current, a fourth transistor configured to provide a sum current of the first current and the third current, and a current mirror configured provide a hybrid current mirroring the sum current.

18 Claims, 6 Drawing Sheets

BIAS CURRENT WITH HYBRID TEMPERATURE PROFILE

CROSS REFERENCE TO RELATED APPLICATIONS

The current application claims priority to, and the benefit of, U.S. Provisional Application No. 63/355,347 filed Jun. 24, 2022 and entitled "BIAS CURRENT WITH HYBRID TEMPERATURE COEFFICIENT PROFILE," the contents of which are hereby incorporated by reference in their entireties.

BACKGROUND

Integrated circuits (ICs) are commonly designed with the zero temperature coefficient (ZTC) bias scheme or the positive temperature coefficient (PTC) bias scheme (also known as proportional to absolute temperature (PTAT) bias). A ZTC bias circuit may be a circuit that provides a bias current that is substantially invariant to temperature changes. A PTC bias circuit may be a circuit that provides a bias current that changes proportionally with temperature. However, a ZTC bias circuit may be unable to provide sufficient current and/or gain above a certain temperature. Similarly, a PTC bias circuit, while able to provide sufficient current and/or gain above a certain temperature, may be unable to provide sufficient current and/or gain below a certain temperature.

Thus, improvements in such bias circuits are desired.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

Aspects of the present disclosure may include a circuit configured to compensate for circuit gain loss at high temperatures, without the signal levels becoming insufficiently small at low temperatures. Further, aspects of the present disclosure may include a circuit configured to increase bias current at high temperatures, without the bias current becoming insufficiently small at low temperatures. Additionally, aspects of the present disclosure may include a circuit to be configured to improve the performance of a system at high temperatures, without degraded performance at low temperatures.

Aspects of the present disclosure may include a hybrid circuit having a first current source configured to output a first current having a first temperature slope, a second current source configured to output a second current having a second temperature slope, and a hybrid circuit configured to receive the first current and the second current and output a larger current of the first current and the second current as a hybrid current.

Aspects of the present disclosure include a hybrid circuit, including a first current sink configured to sink a zero temperature coefficient (ZTC) current provided by a ZTC current source, a second current sink configured to sink a positive temperature coefficient (PTC) current provided by a PTC current source, a first transistor configured to provide a first current having a first current magnitude of zero in response to the ZTC current being larger than the PTC current or a second current magnitude of a difference between the PTC current and the ZTC current in response to the PTC current being larger than the ZTC current, a second transistor configured to provide a second current having a third current magnitude of the ZTC current in response to the PTC current being larger than the PTC current or a fourth current magnitude of the PTC current in response to the ZTC current being larger than the ZTC current, a third transistor configured to provide a third current mirroring the ZTC current, a fourth transistor configured to provide a sum current of the first current and the third current, and a current mirror configured provide a hybrid current mirroring the sum current.

Aspects of the present disclosure include a hybrid circuit including a first current sink connected to a zero temperature coefficient (ZTC) current source, corresponding gate terminals of a second transistor and a third transistor, and a ground terminal, a second current sink connected to a positive temperature coefficient (PTC) current source, a corresponding gate terminal of a first transistor, and the ground terminal, the first transistor connected to a corresponding drain terminal of the second transistor, a corresponding drain terminal of the third transistor, a corresponding drain terminal of a fourth transistor, and the ground terminal, the second transistor connected to the ZTC current source, the PTC current source, a corresponding gate terminal of the first current sink, a corresponding gate terminal of the second current sink, the corresponding gate terminal of the first transistor, the corresponding gate terminal of the third transistor, and the ground terminal, the third transistor connected to the ZTC current source, the corresponding gate terminal of the first current sink, the corresponding gate terminal of the second transistor, a corresponding drain terminal of the first transistor the corresponding drain terminal of the fourth transistor, and the ground terminal, the fourth transistor connected to a voltage supply, a corresponding gate terminal of a current mirror, the corresponding drain terminal of the first transistor, and the corresponding drain terminal of the third transistor, the current mirror connected to the voltage supply.

Aspects of the present disclosure include a method of providing a hybrid current including sinking, by a first current sink, a zero temperature coefficient (ZTC) current provided by a ZTC current source, sinking, by a second current sink, a positive temperature coefficient (PTC) current provided by a PTC current source, providing, by a first transistor, a first current having a first current magnitude of zero in response to the ZTC current being larger than the PTC current or a second current magnitude of a difference between the PTC current and the ZTC current in response to the PTC current being larger than the ZTC current, providing, by a second transistor, a second current having a third current magnitude of the ZTC current in response to the PTC current being larger than the PTC current or a fourth current magnitude of the PTC current in response to the ZTC current being larger than the ZTC current, providing, by a third transistor, a third current mirroring the ZTC current, providing, by a fourth transistor, a sum current of the first current and the third current, and providing, by a current mirror, a hybrid current mirroring the sum current.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

According to one aspect of the present disclosure, an integrated circuit (IC) bias scheme may operate with a positive temperature coefficient (PTC) at temperatures above a threshold temperature, and with zero temperature coefficient (ZTC) at temperatures below the threshold temperature. This hybrid approach may compensate for gain loss at higher temperatures without sacrificing signal levels at lower temperatures.

Figure 1:
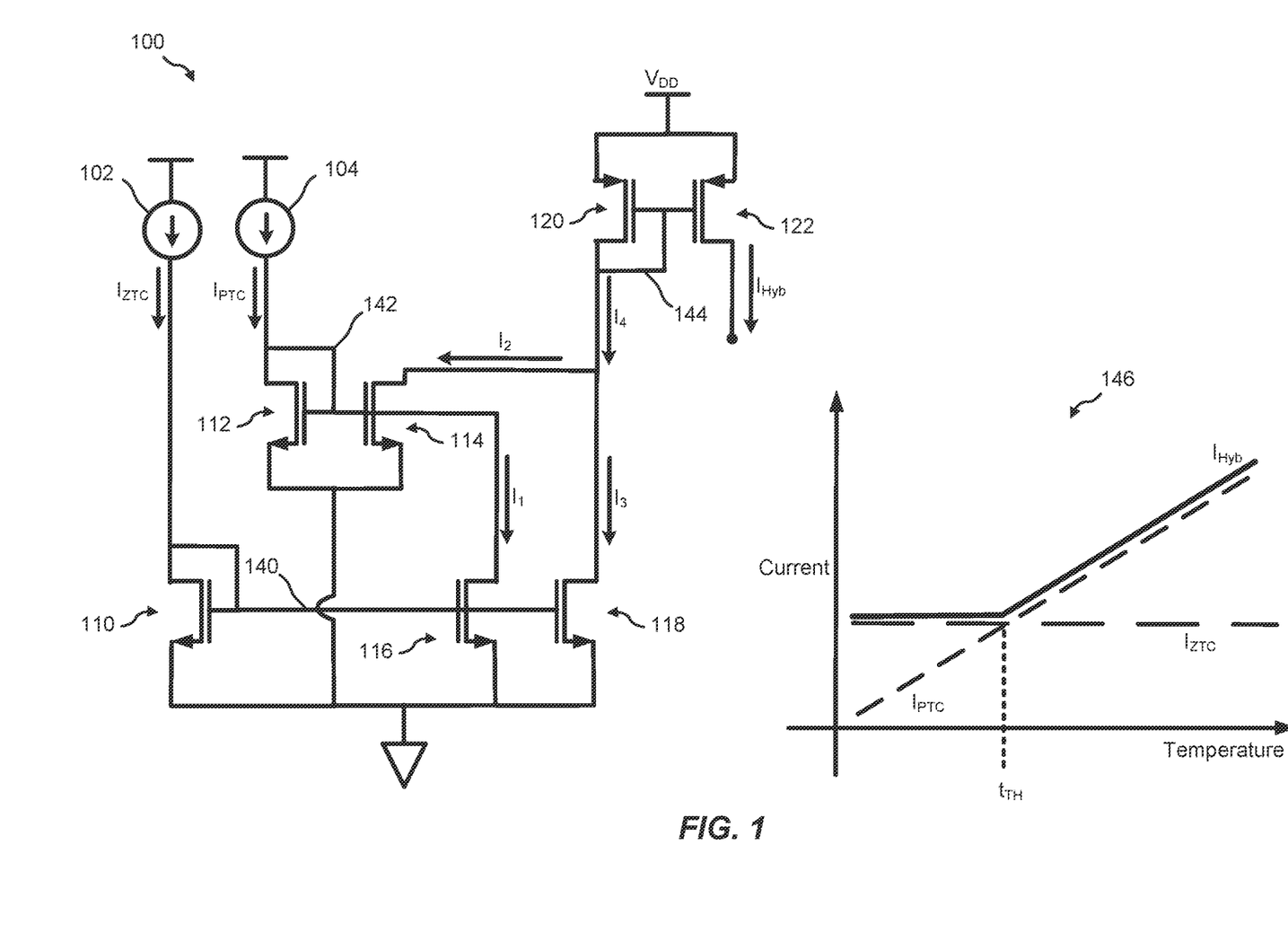
FIG. 1 is a circuit diagram of an example of a hybrid circuit, including an inset graph of current versus temperature performance of the hybrid circuit, according to aspects of the present disclosure.

Referring to FIG. 1, a hybrid circuit 100 configured to provide a PTC current at temperatures above a threshold temperature, and a ZTC current at temperatures below the threshold temperature. The hybrid circuit 100 may include a ZTC current source 102 configured to provide a ZTC current $I_{ZTC}$ into the hybrid circuit 100. The hybrid circuit 100 may include a PTC current source 104 configured to provide a PTC current $I_{PTC}$ into the hybrid circuit 100. The hybrid circuit 100 may include a first current sink 110 configured to sink the ZTC current $I_{ZTC}$. The hybrid circuit 100 may include a second current sink 112 configured to sink the PTC current $I_{PTC}$. The first current sink 110 may be disposed in series, parallel, or other configurations with respect to the ZTC current source 102. The second current sink 112 may be disposed in series, parallel, or other configurations with respect to the PTC current source 104.

In some aspects of the present disclosure, the hybrid circuit 100 may include a first transistor 114 configured to provide a second current $I_2$, which may be the maximum of zero current and the difference between the PTC current $I_{PTC}$ and the ZTC current $I_{ZTC}$. The hybrid circuit 100 may include a second transistor 116 configured to sink a first current $I_1$, which may be the minimum of the ZTC current $I_{ZTC}$ and the PTC current $I_{PTC}$. The hybrid circuit 100 may include a third transistor 118 configured to sink a third current $I_3$, which may be the ZTC current $I_{ZTC}$.

In certain aspects of the present disclosure, the hybrid circuit 100 may include a first current source 120 configured to accept a fourth current $I_4$, which may be a summation current of the second current $I_2$ and the third current $I_3$. The hybrid circuit 100 may include a current mirror 122 configured to mirror the fourth current $I_4$ and provide a hybrid current $I_{Hyb}$. The first current source 120 and the current mirror 122 may be connected to a voltage supply $V_{DD}$.

During normal operation, in certain aspects of the present disclosure, the ZTC current source 102 may provide the ZTC current $I_{ZTC}$ toward the first current sink 110. The ZTC current $I_{ZTC}$ may cause a first gate voltage on a first gate terminal 140. The first gate voltage may turn the first current sink 110, the second transistor 116, and/or the third transistor 118 from an off state to an on state. The first gate voltage may cause the third transistor 118 to mirror the same amount of current (i.e., the third current $I_3$) as $I_{ZTC}$. Specifically, the first gate voltage may turn on the third transistor 118, which may provide the third current $I_3$. Since the source terminal of the third transistor 118 is connected to the ground terminal, a third gate voltage may be developed on the drain terminal of the third transistor, which is shorted to a third gate terminal 144. Since the first current source 120 is consistently biased in the saturation regime (i.e., gate and drain terminals connected), the third gate voltage may cause the first current source 120 to provide the fourth current.

In some aspects, the PTC current source 104 may provide the PTC current $I_{PTC}$ toward the second current sink 112. The PTC current $I_{PTC}$ may cause a second gate voltage on a second gate terminal 142. The second gate voltage may be insufficient to turn on the second current sink 112 or the first transistor 114, or be sufficient to turn the second current sink 112 and the first transistor 114 from an off state to an on state, depending on the ZTC current $I_{ZTC}$ as explained below.

In some aspects of the present disclosure, as shown in graph 146, for temperatures below a threshold temperature $T_{TH}$, the ZTC current $I_{ZTC}$ may be larger than the PTC current $I_{PTC}$. As explained above, the ZTC current $I_{ZTC}$ may induce the first gate voltage at the first gate terminal 140. Since the ZTC current $I_{ZTC}$ is larger than the PTC current $I_{PTC}$, the first gate voltage may turn on the second transistor 116. Consequently, the PTC current $I_{PTC}$ provided by the PTC current source 104 may not turn on the first transistor 114 because an entire amount of the PTC current $I_{PTC}$ is sunk through the second transistor 116. As such, the second current $I_2$ is zero because the first transistor 114 is off. Therefore, the third current $I_3$ and the fourth current $I_4$ may both equal to the ZTC current $I_{ZTC}$, and the current mirror 122 will provide the hybrid current $I_{Hyb}$ having the same current level as the ZTC current $I_{ZTC}$. In other words, for temperatures below the threshold temperature $T_{TH}$, the hybrid current $I_{Hyb}$ is equal to the ZTC current $I_{ZTC}$.

In other aspects of the present disclosure, for temperature above the threshold temperature $T_{TH}$, the PTC current $I_{PTC}$ may be larger than the ZTC current $I_{ZTC}$. As explained above, the ZTC current $I_{ZTC}$ may induce the first gate voltage at the first gate terminal 140. Since the PTC current $I_{PTC}$ is larger than the ZTC current $I_{ZTC}$, the first gate voltage may turn on the second transistor 116. However, the second transistor 116 is able to sink only the ZTC current $I_{ZTC}$ (which is smaller than the PTC current $I_{PTC}$). Consequently, a differential current (i.e., $I_{PTC}-I_{ZTC}$) may be sunk through the second current sink 112. The differential current may cause the second gate voltage to be developed on the second gate terminal 142. The second gate voltage may turn on the first transistor 114 such that the second current $I_2$ mirrors the differential current (i.e., $I_{PTC}-I_{ZTC}$). Since the third current $I_3$ may be equal to the ZTC current $I_{ZTC}$, the fourth current $I_4$ may become a sum of the second current $I_2$ and the third current $I_3$, which is the PTC current $I_{PTC}$ (i.e., $I_2+I_3=(I_{PTC}-I_{ZTC})+I_{ZTC}=I_{PTC}$). As a result, the current mirror 122 will provide the hybrid current $I_{Hyb}$ having the same current level as the PTC current $I_{PTC}$. In other words, for temperatures above the threshold temperature $T_{TH}$, the hybrid current $I_{Hyb}$ is equal to the PTC current $I_{PTC}$.

In some aspects, the hybrid current $I_{Hyb}$ provided by the hybrid circuit 100 may exhibit characteristics shown in the graph 146. Specifically, at temperatures below the threshold temperature $T_{TH}$, the hybrid current $I_{Hyb}$ may be constant with temperature. And, at temperatures above the threshold temperature $T_{TH}$, the hybrid current $I_{Hyb}$ may increase with temperature. The hybrid current $I_{Hyb}$ may be the maximum current of the PTC current $I_{PTC}$ and the ZTC current $I_{ZTC}$.

In some aspects of the present disclosure, one or more of the first current sink 110, the second current sink 112, the first transistor 114, the second transistor 116, and/or the third transistor 118 may be nMOS (e.g., n-type metal oxide semiconductor field effect transistor (MOSFET)) or other n-type transistors. One or more of the first current source 120 and/or the current mirror 122 may be pMOS or other p-type transistors. The one or more of the first current sink 110, the second current sink 112, the first transistor 114, the second transistor 116, and/or the third transistor 118 may be the same or different (e.g., same or different widths, lengths, dopings, geometries, etc.). The one or more of the first current source 120 and/or the current mirror 122 may be p-type transistors may be the same or different (e.g., same or different widths, lengths, dopings, geometries, etc.).

In certain aspects, the slopes, curvatures, and/or shapes of the current vs. temperature behavior of the hybrid current $I_{Hyb}$ may vary according to some aspects of the present disclosure.

Figure 2:
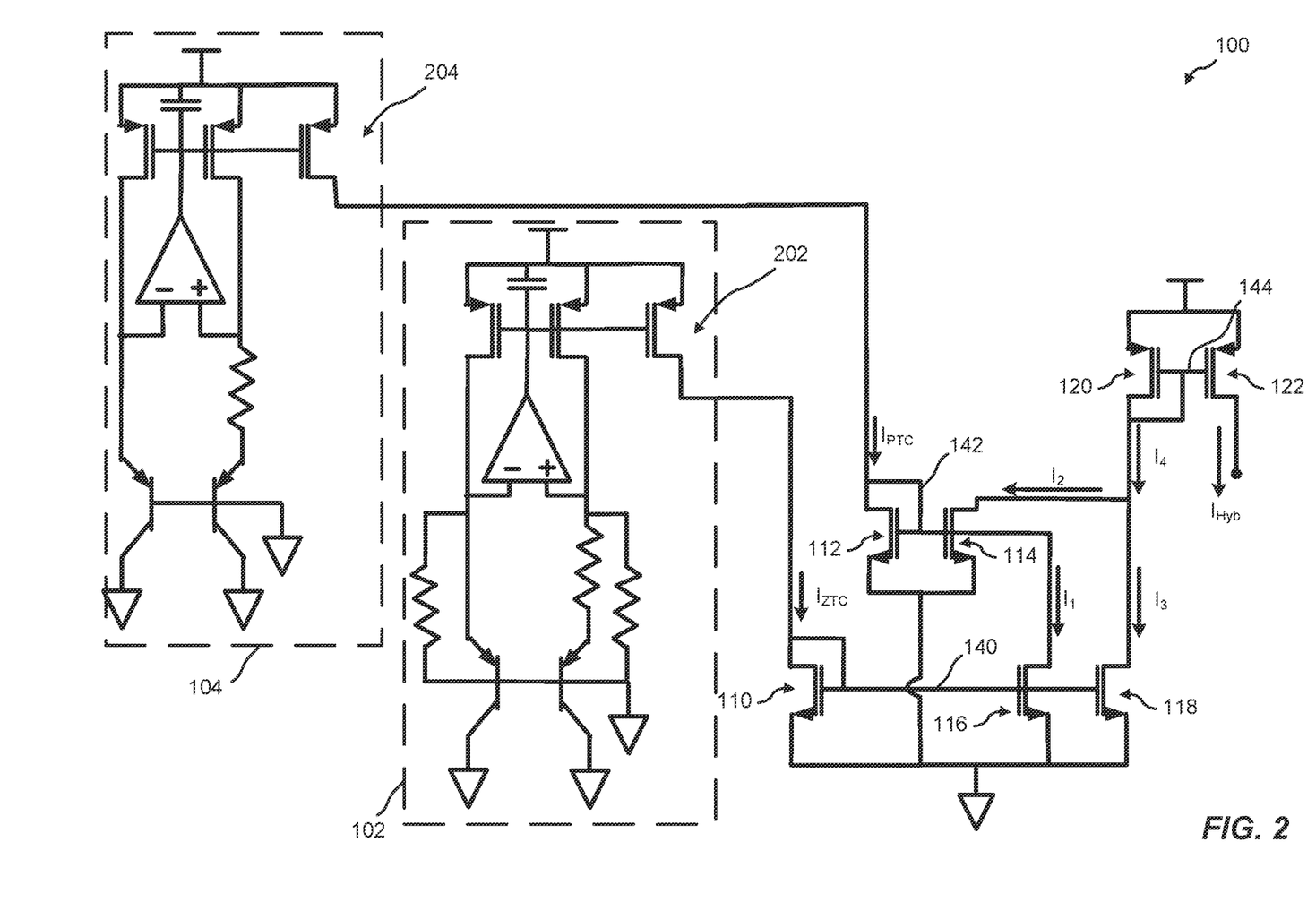
FIG. 2 is a circuit diagram of another example of the hybrid circuit of FIG. 1 according to aspects of the present disclosure.

Referring to FIG. 2, an example of the hybrid circuit 100, including one implementation of input current circuitry, is configured to provide a PTC current at temperatures above a threshold temperature and a ZTC current at temperature below the threshold temperature. The hybrid circuit 100 may include a ZTC current source 202, which is an example of the ZTC current source 102 that provides constant current as temperatures change. The hybrid circuit 100 may include a PTC current source 204, which is an example of the PTC current source 104 that provides current that increases with temperature.

In an aspect, it may be desirable to manage signal levels in On Off Keying (OOK) transmission across an isolation barrier. For example, it may be desirable to compensate for transmission transformer loss at temperatures above the threshold temperature $T_{TH}$ and/or reduce reception signal loss at temperature below the threshold temperature $T_{TH}$. Specifically, a ZTC current source operating alone may provide a constant current below and above the threshold temperature $T_{TH}$. However, as temperatures rise, the transformer loss may increase with the operating temperature. Since the current provided by the ZTC current source remains constant with temperature, the ZTC current source may be unable to compensate for the transmission transformer loss at temperatures above the threshold temperature $T_{TH}$. Similarly, a PTC current source operating alone may provide a current that changes with temperature. As temperatures drop, the current provided by the PTC current source may decrease accordingly. This may cause reception signal loss at temperature below the threshold temperature $T_{TH}$. Aspects of the present disclosure include the hybrid circuit 100 configured to provide a constant current at temperatures below the threshold temperature $T_{TH}$ and a variable temperature at temperatures above the threshold temperature $T_{TH}$.

Figure 3:
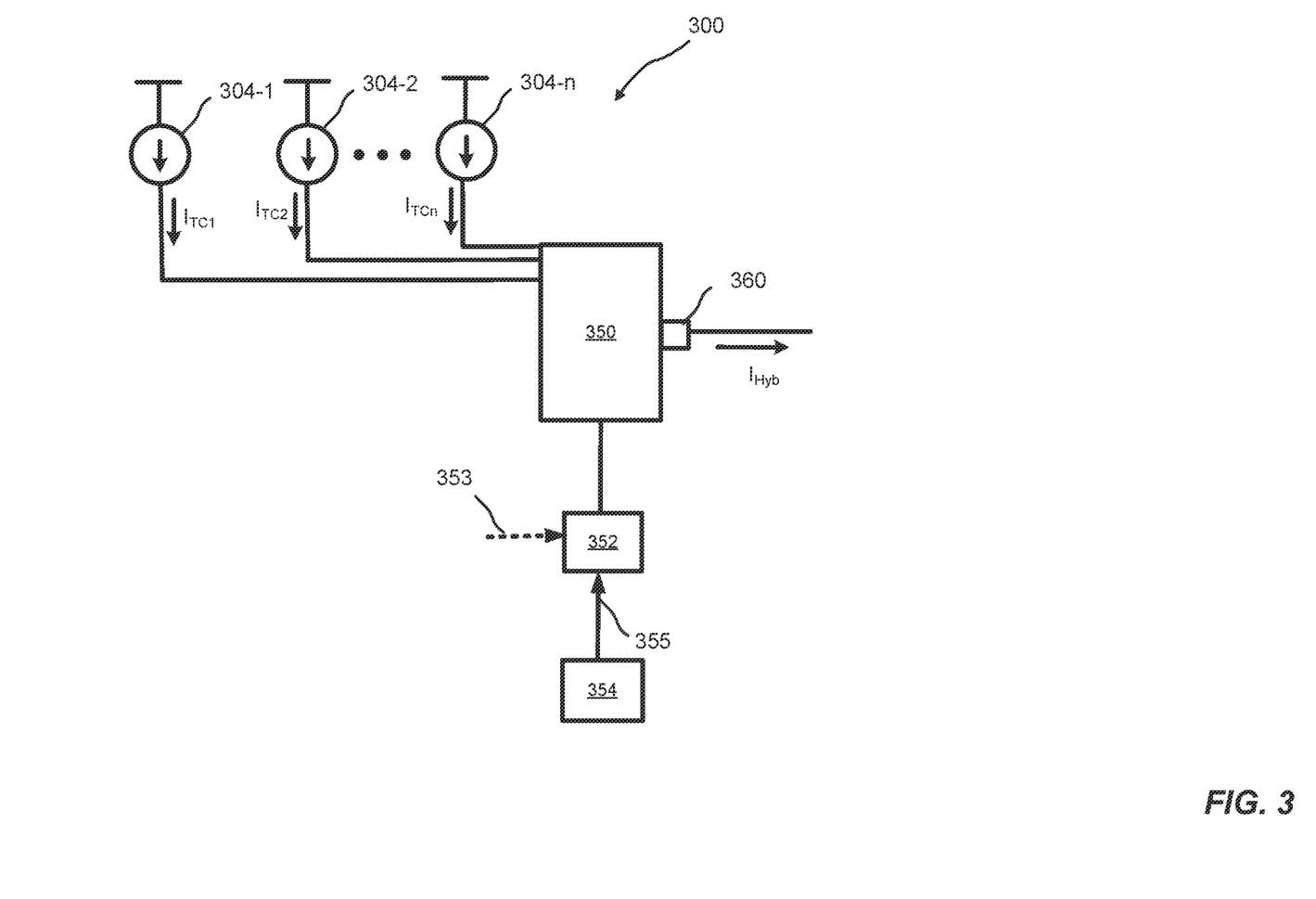
FIG. 3 is a circuit diagram of a further example of the hybrid circuit of FIG. 1 according to aspects of the present disclosure.

Referring to FIG. 3, an example of the hybrid circuit 300 configured to provide a source current with variable slopes at temperatures below and above the threshold temperature $T_{TH}$. The hybrid circuit 300 may be configured to provide variable bias currents, such as but not limited to bias currents with different temperature coefficients (TCs) (i.e., rate of current change as a function of temperature change). For example, the hybrid circuit 300 may include a first TC current source 304-1 configured to provide a first TC current $I_{TC-1}$, a second TC current source 304-2 configured to provide a second TC current $I_{TC-2}$ . . . and an nth TC current source 304-n configured to provide an nth TC current $I_{TC-n}$. Here, n may be a positive integer greater than 1. In some aspects, the hybrid circuit 300 may have two or more TC current sources with different TCs.

In some aspects of the present disclosure, the hybrid circuit 300 may include a multiplexer/combining circuit 350 configured to select one or more of the currents provided by the first TC current source 304-1, the second TC current source 304-2 . . . and/or the nth TC current source 304-n. The currents that are selected may be determined by indications provided to the multiplexer/combining circuit 350. For instance, the selected input currents may have different slopes above and/or below the threshold temperature $T_{TH}$. The hybrid circuit 300 may include a output 360 configured to output a hybrid current $I_{Hyb}$ including a selected PTC current $I_{S-PTC}$ and a selected ZTC current $I_{S-ZTC}$. The selected PTC current $I_{S-PTC}$ may include one or some combination of the first TC current $I_{TC-1}$, the second TC current $I_{TC-2}$ . . . the nth TC current $I_{TC-n}$. The selected ZTC current $I_{S-ZTC}$ may include one or some combination of the first TC current $I_{TC-1}$, the second TC current $I_{TC-2}$ . . . the nth TC current $I_{TC-n}$. In some optional implementations, the multiplexer/combining circuit 350 may be configured to apply one or more gain factors to the one or more of the first TC current $I_{TC-1}$, the second TC current $I_{TC-2}$ . . . the nth TC current $I_{TC-n}$ prior to outputting the $I_{Hyb}$ via the output 360. For example, the multiplexer/combining circuit 350 may amplify the magnitude of the currents prior to outputting the $I_{Hyb}$ via the output 360.

In an aspect, the hybrid circuit 300 may additionally include a decision circuit 352 configured to provide one or more indication signals to the multiplexer/combining circuit 350 for indicating the selection of the one or some combination of the currents provided by the first TC current source 304-1, the second TC current source 304-2 . . . and/or the nth TC current source 304-n. The decision circuit 352 may optionally include one or more analog-to-digital converter (ADC). For example, the decision circuit 352 may receive analog input and output digital control signals. The decision circuit 352 may include logic, functions, or algorithms used to control how the multiplexer/combining circuit 350 generates the $I_{Hyb}$ from one or some combination of the first TC current source 304-1, the second TC current source 304-2 . . . and/or the nth TC current source 304-n. For example, the decision circuit 352 may utilize an input 355 from a temperature sensor 354, e.g., for temperature-dependent generation of the output 360 and/or one or more optional inputs 353, to generate the indication signals. The one or more optional inputs 353 may include, but are not limited to, desired slopes of the current above and/or below the threshold temperature $T_{TH}$. Based on the desired slopes, the decision circuit 352 may control the multiplexer/combining circuit 350 to select one or more of the currents provided by the first TC current source 304-1, the second TC current source 304-2 . . . and/or the nth TC current source 304-n.

Figure 4:
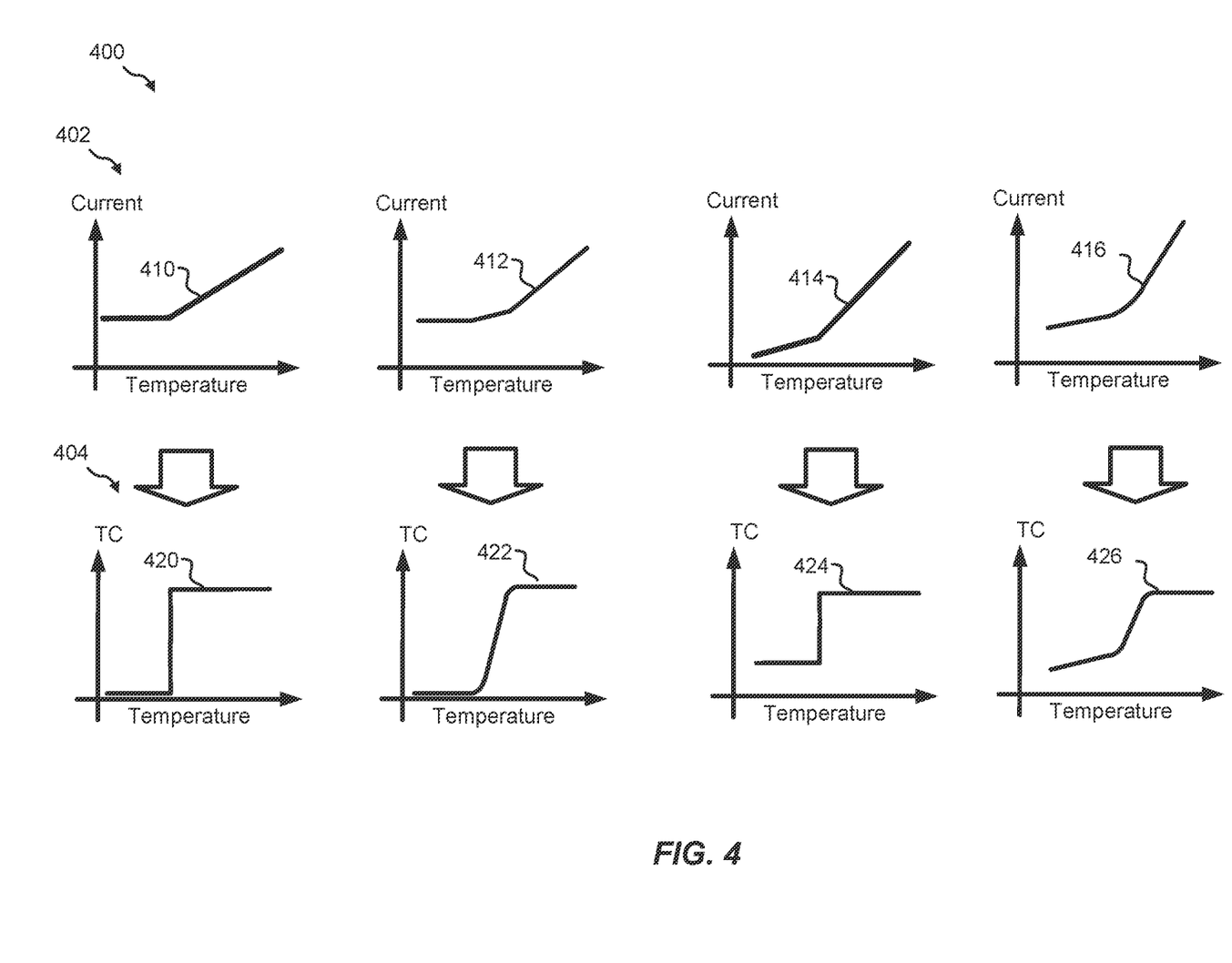
FIG. 4 includes example graphs of example characteristics of the hybrid circuit, including current versus temperature performance, and corresponding temperature coefficient versus temperature performance, according to aspects of the present disclosure.

Referring to FIG. 4, example graphs 400 include example characteristics of the hybrid circuit 100 shown in FIGS. 1 and 2, the hybrid circuit 300 shown in FIG. 3, and/or a p-type hybrid circuit 500 shown in FIG. 5 (below), including current versus temperature characteristic graphs 402 and corresponding temperature coefficient versus temperature characteristic graphs 404, which may be utilized in any of the aspects of the hybrid circuits described herein. In some instances, the temperature coefficients versus temperature characteristics may be derived based on the slope values of the current versus temperature characteristics (i.e., indicating the instantaneous change in the current versus temperature characteristics).

In some cases, a first current graph 410, which may be the same as or similar to graph 146, may illustrate a hybrid circuit output current based on a ZTC current having a zero slope over a first temperature range, and a PTC current having a positive slope over a second temperature range. A second current graph 412 may illustrate a hybrid circuit output current based on a ZTC current having a zero slope over some temperatures, and two PTC currents having different slopes over other temperatures. A third current graph 414 may illustrate a hybrid circuit output current based on a ZTC current having a first positive slope over some temperatures, and a PTC current having a second positive slope larger than the first positive slope over other temperatures. A fourth current graph 416 may illustrate a hybrid circuit output current based on a ZTC current having a first variably positive slope over some temperatures, and a PTC current having a second variably positive slope over other temperatures. The fourth current graph 416 may illustrate an example of a hybrid circuit having gradual (non-abrupt) transition between a ZTC current having a first zero or positive slope and a PTC current having a second positive slope larger than the slope of the ZTC current.

In some aspects of the present disclosure, a first TC graph 420 may illustrate the TC curve corresponding to the hybrid circuit output current in the first current graph 410. The first TC graph 420 shows that the slope of the ZTC current is zero and the slope of the PTC current is a positive number. A second TC graph 422 may illustrate the TC curve corresponding to the hybrid circuit output current in the second current graph 412. The second TC graph 422 shows that the slope of the ZTC current is zero and the slope of the PTC current increases with temperatures in a first temperature range and remains a positive number in a second temperature range. A third TC graph 424 illustrates the TC curve corresponding to the hybrid circuit output current in the third current graph 414. The third TC graph 424 shows that the slope of the ZTC current is a first positive number and the slope of the PTC current is a second positive number larger than the first positive number. A fourth TC graph 426 illustrates the TC curve corresponding to the hybrid circuit output current in the fourth current graph 416. The fourth TC graph 426 shows that the slope of the ZTC current increases with temperature, and the slope of the PTC current increases with temperatures in a first temperature range and remains a positive number in a second temperature range.

Other current and/or TC profiles may also be implemented according to aspects of the present disclosure.

Figure 5:
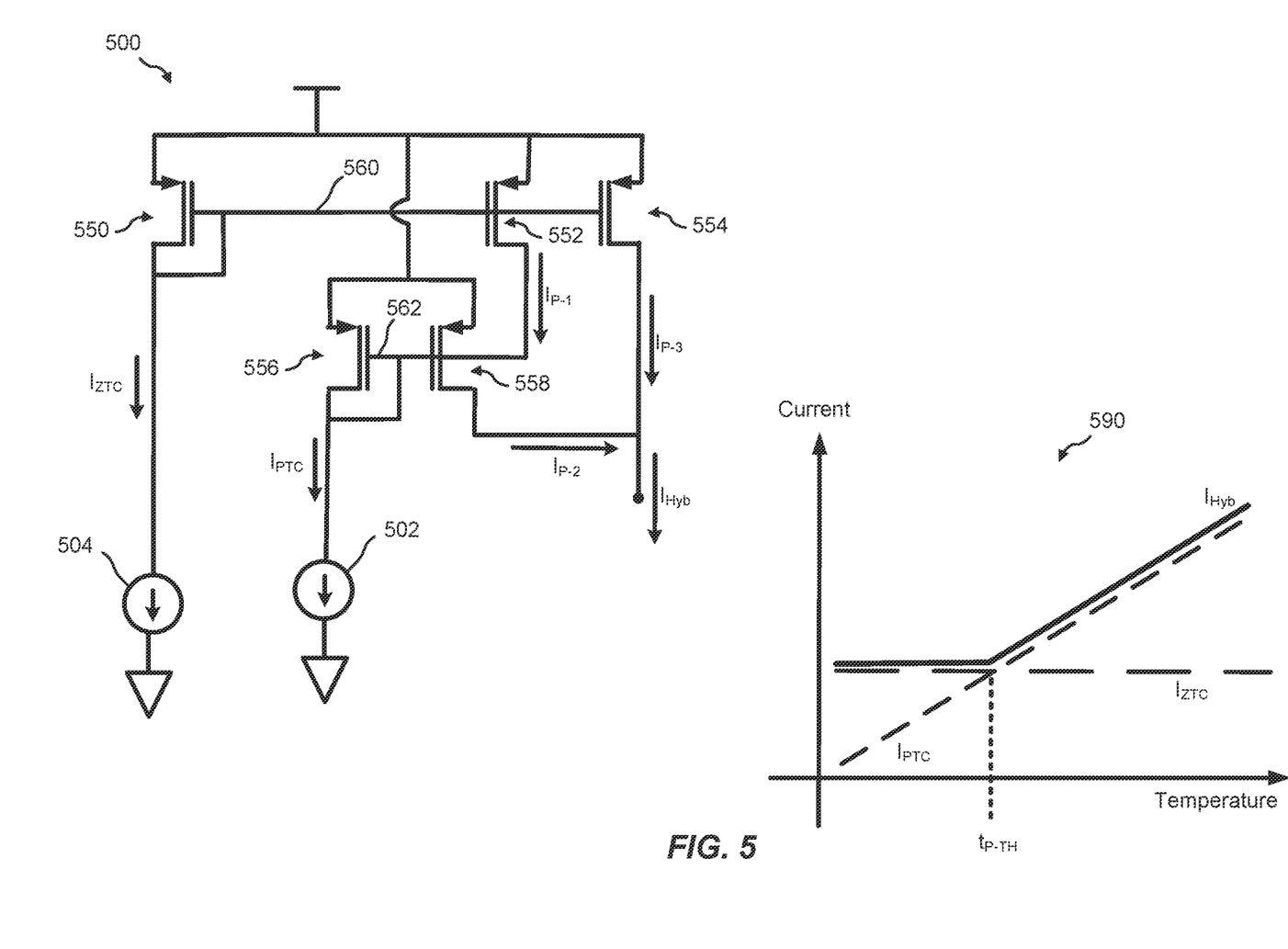
FIG. 5 is a circuit diagram of an example of another hybrid circuit, including an inset graph of current versus temperature performance of the hybrid circuit, according to aspects of the present disclosure.

Referring to FIG. 5, an example of a p-type hybrid circuit 500 is configured to provide a PTC current at temperatures above a threshold temperature and a ZTC current at temperature below the threshold temperature. The p-type hybrid circuit 500 may include a PTC current source 502 configured to sink the PTC current $I_{PTC}$ from the p-type hybrid circuit 500. The p-type hybrid circuit 500 may include a ZTC current source 504 configured to sink the ZTC current $I_{ZTC}$ from the p-type hybrid circuit 500. The p-type hybrid circuit 500 may include a first P current source 550 configured to source the ZTC current $I_{ZTC}$ toward the ZTC current source 504. The p-type hybrid circuit 500 may include a first P transistor 552 configured to provide a first P current $I_{P-1}$, which may be the minimum of the PTC current $I_{PTC}$ and the ZTC current $I_{ZTC}$. The p-type hybrid circuit 500 may include a first P current mirror 554 configured to provide a third P current $I_{P-3}$ that mirrors the ZTC current $I_{ZTC}$ sourced by the first P current source 550. The third P current $I_{P-3}$ may have the same magnitude as the ZTC current $I_{ZTC}$. The first p current source 550 may be disposed in series, parallel, or other configurations with respect to the ZTC current source 504.

In certain aspects of the present disclosure, the p-type hybrid circuit 500 may include a second P transistor 556 configured to provide a variable current ranging from zero to a differential current between the PTC current $I_{PTC}$ and the ZTC current $I_{ZTC}$ as described in further details below. The p-type hybrid circuit 500 may include a second P current mirror 558 configured to provide a second P current $I_{P-2}$ that mirrors the variable current provided by the second P transistor 556.

During normal operation, in certain aspects, the first P current source 550 may provide the ZTC current $I_{ZTC}$ in response to the ZTC current source 504. Because the drain terminal and the gate terminal of the first P current source 550 are connected, the first P current source 550 may operate in the saturation regime and a fourth gate voltage at a fourth gate terminal 560 may be developed on the drain terminal and the gate terminal of the first P current source 550. Consequently, the fourth gate voltage may be applied to the fourth gate terminal 560, including the gate terminals of the first P transistor 552 and/or the first P current mirror 554. As a result, the first P current mirror 554 may source the third P current $I_{P-3}$.

In some aspects of the present disclosure, as shown in a graph 590, for temperatures above a P threshold temperature $T_{P-TH}$, the PTC current $I_{PTC}$ may be larger than the ZTC current $I_{ZTC}$. The PTC current $I_{PTC}$ may induce a fifth gate voltage at the fifth gate terminal 562. Since the PTC current $I_{PTC}$ is larger than the ZTC current $I_{ZTC}$, the fifth gate voltage may turn on the second P transistor 556 because the first P current $I_{P-1}$ (having a current magnitude equaling to the ZTC current $I_{ZTC}$) is insufficient to supply the PTC current $I_{PTC}$ alone. The fifth gate voltage may turn on the second P transistor 556 such that the second P transistor 556 supplies the differential current between the PTC current $I_{PTC}$ and the ZTC current $I_{ZTC}$. Consequently, the second P current mirror 558 may mirror the second P transistor 556 and supply the second P current $I_{P-2}$ (having the same magnitude as the differential current $I_{PTC}-I_{ZTC}$). Therefore, the second P current $I_{P-2}$ may equal to the differential current of $I_{PTC}-I_{ZTC}$ and the third P current $I_{P-3}$ may equal to the ZTC current $I_{ZTC}$. As a result, the hybrid current $I_{Hyb}$ may equal to the sum of the second P current $I_{P-2}$ and the third P current $I_{P-3}$, which is the PTC current $I_{PTC}$. In other words, for temperatures above the P threshold temperature TP-TH, the hybrid current $I_{Hyb}$ is equal to the PTC current $I_{PTC}$.

In other aspects of the present disclosure, for temperature below the P threshold temperature $T_{P-TH}$, the ZTC current $I_{ZTC}$ may be larger than the PTC current $I_{PTC}$. As such, the first P transistor 552 may supply the ZTC current $I_{ZTC}$ as the first P current $I_{P-1}$. Consequently, the fifth gate voltage may remain "high" to keep the second P transistor 556 off. The second P current mirror 558 may similarly remain in the off state and supply no current as the second P current $I_{P-2}$. As a result, the hybrid current $I_{Hyb}$ may equal to the sum of the second P current $I_{P-2}$ and the third P current $I_{P-3}$, which is the ZTC current $I_{ZTC}$. In other words, for temperatures below the P threshold temperature $T_{P-TH}$, the hybrid current $I_{Hyb}$ is equal to the ZTC current $I_{ZTC}$.

In some aspects, the hybrid current $I_{Hyb}$ provided by the hybrid circuit 100 may exhibit characteristics shown in the graph 590. At temperatures below the P threshold temperature $T_{P-TH}$, the hybrid current $I_{Hyb}$ may be constant with temperature. At P threshold temperature $T_{P-TH}$, the hybrid current $I_{Hyb}$ may increase with temperature. The hybrid current $I_{Hyb}$ may be the maximum current of the PTC current $I_{PTC}$ and the ZTC current $I_{ZTC}$.

Figure 6:
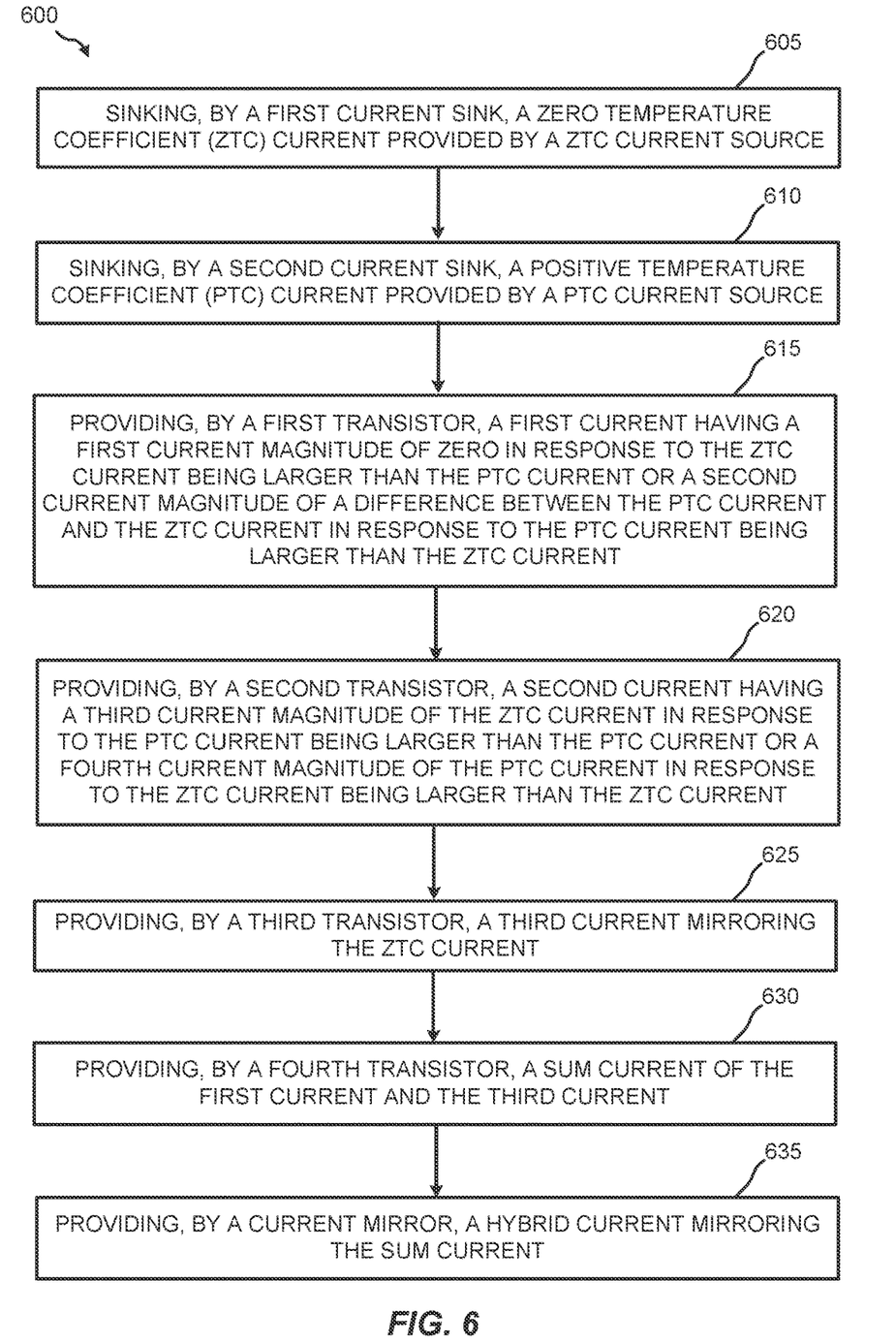
FIG. 6 is a flowchart of an example of a method for providing a hybrid circuit according to aspects of the present disclosure.

Turning to FIG. 6, a method 600 of providing a hybrid current may be performed by the hybrid circuit 100, the p-type hybrid circuit 500, and/or subcomponents of the hybrid circuit 100 and/or the p-type hybrid circuit 500.

At block 605, the method 600 may sink, by a first current sink, a zero temperature coefficient (ZTC) current provided by a ZTC current source. For example, the first current sink 110 may sink the ZTC current $I_{ZTC}$ provided by the ZTC current source 102 or the ZTC current source 504.

At block 610, the method 600 may sink, by a second current sink, a positive temperature coefficient (PTC) current provided by a PTC current source. For example, the second current sink 112 may sink the PTC current $I_{PTC}$ provided by the PTC current source 104 or the PTC current source 502.

At block 615, the method 600 may provide, by a first transistor, a first current having a first current magnitude of zero in response to the ZTC current being larger than the PTC current or a second current magnitude of a difference between the PTC current and the ZTC current in response to the PTC current being larger than the ZTC current. For example, the first transistor 114 may provide the second current $I_2$ or the second P mirror 558 may provide the second P current $I_{P-2}$.

At block 620, the method 600 may provide, by a second transistor, a second current having a third current magnitude of the ZTC current in response to the PTC current being larger than the PTC current or a fourth current magnitude of the PTC current in response to the ZTC current being larger than the ZTC current. For example, the second transistor 116 may provide the first current $I_1$ or the first P transistor 552 may provide the first P current $I_{P-1}$.

At block 625, the method 600 may provide, by a third transistor, a third current mirroring the ZTC current. For example, the third transistor 118 may mirror the ZTC current by providing the third current $I_3$ or the first P current mirror 554 may mirror the ZTC current by providing the third P current $I_{P-3}$.

At block 630, the method 600 may provide, by a fourth transistor, a sum current of the first current and the third current. For example, the first current source 120 may provide the fourth current $I_4$ or the second P mirror 558 and the first P current mirror 554 may provide the hybrid current $I_{Hyb}$.

At block 635, the method 600 may provide, by a current mirror, a hybrid current mirroring the sum current. For example, the current mirror 122 may provide the hybrid current $I_{Hyb}$ or the second P mirror 558 and the first P current mirror 554 may provide the hybrid current $I_{Hyb}$.

Aspects of the present disclosure include a hybrid circuit, including a first current sink configured to sink a zero temperature coefficient (ZTC) current provided by a ZTC current source, a second current sink configured to sink a positive temperature coefficient (PTC) current provided by a PTC current source, a first transistor configured to provide a first current having a first current magnitude of zero in response to the ZTC current being larger than the PTC current or a second current magnitude of a difference between the PTC current and the ZTC current in response to the PTC current being larger than the ZTC current, a second transistor configured to provide a second current having a third current magnitude of the ZTC current in response to the PTC current being larger than the PTC current or a fourth current magnitude of the PTC current in response to the ZTC current being larger than the ZTC current, a third transistor configured to provide a third current mirroring the ZTC current, a fourth transistor configured to provide a sum current of the first current and the third current, and a current mirror configured provide a hybrid current mirroring the sum current.

Aspects of the present disclosure include the aspect above, further including the ZTC current source and the PTC current source.

Aspects of the present disclosure include any of the aspects above, wherein the ZTC current source comprises a plurality of current sources configured to each provide a corresponding source current having a different temperature coefficient of a plurality of temperature coefficients.

Aspects of the present disclosure include any of the aspects above, wherein the PTC current source comprises a plurality of current sources configured to each provide a corresponding source current having a different temperature coefficient of a plurality of temperature coefficients.

Aspects of the present disclosure include any of the aspects above, further including a plurality of current sources configured to each provide a corresponding source current having a different temperature coefficient of a plurality of temperature coefficients.

Aspects of the present disclosure include any of the aspects above, further including a multiplexer configured to receive one or more source currents of the plurality of current sources, combine the one or more source currents as a combined current, and output the combined current as the PTC current or the ZTC current.

Aspects of the present disclosure include any of the aspects above, further including a temperature sensor configured to measure a temperature associated with the hybrid circuit, and output an indication indicating the temperature measured by the temperature sensor.

Aspects of the present disclosure include any of the aspects above, further including a decision circuit configured to select the one or more source currents based at least partially on the indication.

Aspects of the present disclosure include a hybrid circuit including a first current sink connected to a zero temperature coefficient (ZTC) current source, corresponding gate terminals of a second transistor and a third transistor, and a ground terminal, a second current sink connected to a positive temperature coefficient (PTC) current source, a corresponding gate terminal of a first transistor, and the ground terminal, the first transistor connected to a corresponding drain terminal of the second transistor, a corresponding drain terminal of the third transistor, a corresponding drain terminal of a fourth transistor, and the ground terminal, the second transistor connected to the ZTC current source, the PTC current source, a corresponding gate terminal of the first current sink, a corresponding gate terminal of the second current sink, the corresponding gate terminal of the first transistor, the corresponding gate terminal of the third transistor, and the ground terminal, the third transistor connected to the ZTC current source, the corresponding gate terminal of the first current sink, the corresponding gate terminal of the second transistor, a corresponding drain terminal of the first transistor the corresponding drain terminal of the fourth transistor, and the ground terminal, the fourth transistor connected to a voltage supply, a corresponding gate terminal of a current mirror, the corresponding drain terminal of the first transistor, and the corresponding drain terminal of the third transistor, the current mirror connected to the voltage supply.

Aspects of the present disclosure include the aspect above, wherein the first transistor is configured to provide a first current having a first current magnitude of zero in response to the ZTC current being larger than the PTC current, or a second current magnitude of a difference between the PTC current and the ZTC current in response to the PTC current being larger than the ZTC current.

Aspects of the present disclosure include any of the aspects above, wherein the second transistor is configured to provide a second current having a third current magnitude of the ZTC current in response to the PTC current being larger than the PTC current, or a fourth current magnitude of the PTC current in response to the ZTC current being larger than the ZTC current.

Aspects of the present disclosure include any of the aspects above, wherein the fourth transistor is configured to provide a sum current of the first current and the third current.

Aspects of the present disclosure include any of the aspects above, wherein the current mirror is configured provide a hybrid current mirroring the sum current.

Aspects of the present disclosure include any of the aspects above, wherein the third transistor mirror is configured to provide a current mirroring the ZTC current.

Aspects of the present disclosure include any of the aspects above, further including a plurality of current sources connected to a multiplexer, the multiplexer connected one or more of a decision circuit or a temperature sensor, the decision circuit, and the temperature sensor.

Aspects of the present disclosure include any of the aspects above, wherein the plurality of current sources are configured to each provide a corresponding source current having a different temperature coefficient of a plurality of temperature coefficients.

Aspects of the present disclosure include any of the aspects above, wherein the multiplexer is configured to receive one or more source currents of the plurality of current sources, combine the one or more source currents as a combined current, and output the combined current as the PTC current or the ZTC current.

Aspects of the present disclosure include any of the aspects above, wherein the temperature sensor is configured to measure a temperature associated with the hybrid circuit, and output an indication indicating the temperature measured by the temperature sensor.

Aspects of the present disclosure include any of the aspects above, wherein the decision circuit is configured to select the one or more source currents based at least partially on the indication.

Aspects of the present disclosure include a method of providing a hybrid current including sinking, by a first current sink, a zero temperature coefficient (ZTC) current provided by a ZTC current source, sinking, by a second current sink, a positive temperature coefficient (PTC) current provided by a PTC current source, providing, by a first transistor, a first current having a first current magnitude of zero in response to the ZTC current being larger than the PTC current or a second current magnitude of a difference between the PTC current and the ZTC current in response to the PTC current being larger than the ZTC current, providing, by a second transistor, a second current having a third current magnitude of the ZTC current in response to the PTC current being larger than the PTC current or a fourth current magnitude of the PTC current in response to the ZTC current being larger than the ZTC current, providing, by a third transistor, a third current mirroring the ZTC current, providing, by a fourth transistor, a sum current of the first current and the third current, and providing, by a current mirror, a hybrid current mirroring the sum current.

The above detailed description set forth above in connection with the appended drawings describes examples and does not represent the only examples that may be implemented or that are within the scope of the claims. The term "example," when used in this description, means "serving as an example, instance, or illustration," and not "preferred" or "advantageous over other examples." The detailed description includes specific details for the purpose of providing an understanding of the described techniques. These techniques, however, may be practiced without these specific details. For example, changes may be made in the function and arrangement of elements discussed without departing from the scope of the disclosure. Also, various examples may omit, substitute, or add various procedures or components as appropriate. For instance, the methods described may be performed in an order different from that described, and various steps may be added, omitted, or combined. Also, features described with respect to some examples may be combined in other examples. In some instances, well-known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, computer-executable code or instructions stored on a computer-readable medium, or any combination thereof.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that may be accessed by a computer. By way of example, and not limitation, such computer-readable media may comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that may be used to store computer executable code in the form of instructions or data structures that may be accessed by a computer.

The various illustrative blocks and components described in connection with the disclosure herein may be implemented or performed with a specially-programmed device, such as but not limited to a processor, a digital signal processor (DSP), an ASIC, a FPGA or other programmable logic device, a discrete gate or transistor logic, a discrete hardware component, or any combination thereof designed to perform the functions described herein. A specially-programmed processor may be a microprocessor, but in the alternative, the processor may be any conventional processor, controller, microcontroller, or state machine. A specially-programmed processor may also be implemented as a combination of computing devices, e.g., a combination of a DSP and a microprocessor, multiple microprocessors, one or more microprocessors in conjunction with a DSP core, or any other such configuration.

The functions described herein may be implemented in hardware, software executed by a processor, firmware, or any combination thereof. If implemented in software executed by a processor, the functions may be stored on or transmitted over as one or more instructions or code on a non-transitory computer-readable medium. Other examples and implementations are within the scope and spirit of the disclosure and appended claims. For example, due to the nature of software, functions described above may be implemented using software executed by a specially programmed processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C).

Computer-readable media includes both computer storage media and communication media including any medium that facilitates transfer of a computer program from one place to another. A storage medium may be any available medium that may be accessed by a general purpose or special purpose computer. By way of example, and not limitation, computer-readable media may comprise RAM, ROM, EEPROM, CD-ROM or other optical disk storage, magnetic disk storage or other magnetic storage devices, or any other medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the common principles defined herein may be applied to other variations without departing from the spirit or scope of the disclosure. Furthermore, although elements of the described aspects may be described or claimed in the singular, the plural is contemplated unless limitation to the singular is explicitly stated. Additionally, all or a portion of any aspect may be utilized with all or a portion of any other aspect, unless stated otherwise. Thus, the disclosure is not to be limited to the examples and designs described herein but is to be accorded the widest scope consistent with the principles and novel features disclosed herein.

What is claimed is:

1. A hybrid circuit, comprising:
    at least a first current source configured to output a first current having a first temperature slope;
    at least a second current source configured to output a second current having a second temperature slope; and
    a circuit configured to:
        receive the first current and the second current; and
        output a larger current of the first current and the second current as a hybrid current;

wherein the circuit comprises:
  a first current sink configured to sink a zero temperature coefficient (ZTC) current provided by the at least first current source;
  a second current sink configured to sink a positive temperature coefficient (PTC) current provided by the at least second current source;
  a first transistor configured to provide a first current having:
    a first current magnitude of zero in response to the ZTC current being larger than the PTC current, or
    a second current magnitude of a difference between the PTC current and the ZTC current in response to the PTC current being larger than the ZTC current;
  a second transistor configured to provide a second current having:
    a third current magnitude of the ZTC current in response to the PTC current being larger than the ZTC current, or
    a fourth current magnitude of the PTC current in response to the ZTC current being larger than the PTC current;
  a third transistor configured to provide a third current mirroring the ZTC current;
  a fourth transistor configured to provide a sum current of the first current and the third current; and
  a current mirror configured to provide the hybrid current mirroring the sum current.

2. The hybrid circuit of claim 1, wherein:
the at least first current source is a ZTC current source; and
the at least second current source is a PTC current source.

3. The hybrid circuit of claim 2, wherein the ZTC current source comprises a plurality of current sources configured to each provide a corresponding source current having a different temperature coefficient of a plurality of temperature coefficients.

4. The hybrid circuit of claim 2, wherein the PTC current source comprises a plurality of current sources configured to each provide a corresponding source current having a different temperature coefficient of a plurality of temperature coefficients.

5. The hybrid circuit of claim 1, further comprising:
a plurality of additional current sources configured to output a plurality of additional currents having a plurality of additional temperature slopes;
wherein the circuit is a multiplexer configured to:
  select one or more of the first current, the second current, or one or more of the plurality of additional currents; and
  output the one or more selected currents.

6. The hybrid circuit of claim 5, wherein the multiplexer is further configured to apply one or more gain factors to the one or more selected currents.

7. The hybrid circuit of claim 5, further comprising a decision circuit configured to transmit an indication to the multiplexer indicating the one or more selected currents.

8. The hybrid circuit of claim 7, further comprising:
a temperature sensor configured to detect a temperature associated with the hybrid circuit, wherein the decision circuit is further configured to transmit the indication based on the detected temperature.

9. The hybrid circuit of claim 7, wherein the decision circuit is configured to transmit the indication based on an external input.

10. A hybrid circuit, comprising:
at least a first current source configured to output a first current having a first temperature slope;
at least a second current source configured to output a second current having a second temperature slope; and
a circuit configured to:
  receive the first current and the second current; and
  output a larger current of the first current and the second current as a hybrid current;
wherein the circuit comprises:
  a first current source transistor configured to source a zero temperature coefficient (ZTC) current into the first current source;
  a second current source transistor configured to source a positive temperature coefficient (PTC) current into the at least second current source;
  a first transistor configured to provide a first current having:
    a first current magnitude of the ZTC current in response to the PTC current being larger than the ZTC current, or
    a second current magnitude of the PTC current in response to the ZTC current being larger than the PTC current;
  a second transistor configured to provide a second current having:
    a third current magnitude of zero in response to the ZTC current being larger than the PTC current, or
    a fourth current magnitude of a difference between the ZTC current and the PTC current in response to the PTC current being larger than the ZTC current;
  a third transistor configured to provide a third current mirroring the ZTC current;
  wherein the second current and the third current are output as a hybrid current.

11. The hybrid circuit of claim 10, wherein:
the at least first current source is a ZTC current source; and
the at least second current source is a PTC current source.

12. The hybrid circuit of claim 11, wherein the ZTC current source comprises a plurality of current sources configured to each provide a corresponding source current having a different temperature coefficient of a plurality of temperature coefficients.

13. The hybrid circuit of claim 11, wherein the PTC current source comprises a plurality of current sources configured to each provide a corresponding source current having a different temperature coefficient of a plurality of temperature coefficients.

14. A hybrid circuit, comprising:
a first current sink connected to:
  a zero temperature coefficient (ZTC) current source;
  corresponding gate terminals of a second transistor and a third transistor; and
  a ground terminal;
a second current sink connected to:
  a positive temperature coefficient (PTC) current source;
  a corresponding gate terminal of a first transistor; and
  the ground terminal;
the first transistor connected to:
  a corresponding drain terminal of the second transistor;
  a corresponding drain terminal of the third transistor;
  a corresponding drain terminal of a fourth transistor; and
  the ground terminal;

the second transistor connected to:
- the ZTC current source;
- the PTC current source;
- a corresponding gate terminal of the first current sink;
- a corresponding gate terminal of the second current sink;
- the corresponding gate terminal of the first transistor;
- the corresponding gate terminal of the third transistor; and
- the ground terminal;

the third transistor connected to:
- the ZTC current source;
- the corresponding gate terminal of the first current sink;
- the corresponding gate terminal of the second transistor;
- a corresponding drain terminal of the first transistor
- the corresponding drain terminal of the fourth transistor; and
- the ground terminal;

the fourth transistor connected to:
- a voltage supply;
- a corresponding gate terminal of a current mirror;
- the corresponding drain terminal of the first transistor; and
- the corresponding drain terminal of the third transistor;

the current mirror connected to the voltage supply.

15. The hybrid circuit of claim 14, further comprising:
the ZTC current source; and
the PTC current source.

16. The hybrid circuit of claim 15, wherein the ZTC current source comprises a plurality of current sources configured to each provide a corresponding source current having a different temperature coefficient of a plurality of temperature coefficients.

17. The hybrid circuit of claim 15, wherein the PTC current source comprises a plurality of current sources configured to each provide a corresponding source current having a different temperature coefficient of a plurality of temperature coefficients.

18. A method of providing a hybrid current by a hybrid circuit, comprising:
- sinking, by a first current sink, a zero temperature coefficient (ZTC) current provided by a ZTC current source;
- sinking, by a second current sink, a positive temperature coefficient (PTC) current provided by a PTC current source;
- providing, by a first transistor, a first current having a first current magnitude of zero in response to the ZTC current being larger than the PTC current or a second current magnitude of a difference between the PTC current and the ZTC current in response to the PTC current being larger than the ZTC current;
- providing, by a second transistor, a second current having a third current magnitude of the ZTC current in response to the PTC current being larger than the ZTC current or a fourth current magnitude of the PTC current in response to the ZTC current being larger than the PTC current;
- providing, by a third transistor, a third current mirroring the ZTC current;
- providing, by a fourth transistor, a sum current of the first current and the third current; and
- providing, by a current mirror, a hybrid current mirroring the sum current.

\* \* \* \* \*